United States Patent
Li et al.

(10) Patent No.: US 12,040,030 B2
(45) Date of Patent: Jul. 16, 2024

(54) METHOD AND DEVICE FOR GENERATING COMMAND SEQUENCE, METHOD AND DEVICE FOR TESTING, AND STORAGE MEDIUM

(71) Applicant: CHANGXIN MEMORY TECHNOLOGIES, INC., Hefei (CN)

(72) Inventors: Yu Li, Hefei (CN); Changqing Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 267 days.

(21) Appl. No.: 17/844,226

(22) Filed: Jun. 20, 2022

(65) Prior Publication Data

US 2023/0317197 A1 Oct. 5, 2023

Related U.S. Application Data

(63) Continuation of application No. PCT/CN2022/086597, filed on Apr. 13, 2022.

(30) Foreign Application Priority Data

Mar. 31, 2022 (CN) .......................... 202210337896.7

(51) Int. Cl.
*G11C 29/08* (2006.01)
*G06F 9/448* (2018.01)
(Continued)

(52) U.S. Cl.
CPC ............ *G11C 29/08* (2013.01); *G06F 9/4498* (2018.02); *G06F 11/263* (2013.01); *G11C 29/18* (2013.01);
(Continued)

(58) Field of Classification Search
CPC ......... G11C 29/08; G11C 29/16; G11C 29/18; G11C 29/4401; G06F 11/263; G06F 11/221; G06F 13/1631; G06F 13/124
See application file for complete search history.

(56) References Cited

U.S. PATENT DOCUMENTS 5,060,142 A 10/1991 Menon
11,307,947 B2 4/2022 Cardoso
(Continued)

FOREIGN PATENT DOCUMENTS

CN 102623069 A 8/2012
CN 109063323 A 12/2018
(Continued)

OTHER PUBLICATIONS

Shi et al., Generating cyclic-random sequence in a constrained space for In-system validation, IEEE Trans. on Computers, vol. 65, No. 12, pp. 3676-3686. (Year: 2016).*
(Continued)

*Primary Examiner* — Shelly A Chase
(74) *Attorney, Agent, or Firm* — Syncoda LLC; Feng Ma

(57) ABSTRACT

The embodiments of the disclosure provide a method and device for generating a command sequence, a method and device for testing, and a storage medium. The method for generating a command sequence includes that: at least one executable CMD is determined based on a state machine module according to a current state; a command weight corresponding to the at least one executable CMD is acquired, and a random command is generated from the at least one executable CMD by taking the command weight as a constraint condition; and a next state is determined based on the state machine module according to the random command, and the next state is taken as the current state to continuously execute the step of determining at least one executable CMD based on the state machine module accord-
(Continued)

```
┌─────────────────────────────────────────────────────────────┐
│ Determine a to-be-tested random command sequence; the random│
│ command sequence includes a plurality of command sequence   │── S401
│ units, and each command sequence unit is composed of a      │
│ random command and a random address                         │
└─────────────────────────────────────────────────────────────┘
                              │
                              ▼
┌─────────────────────────────────────────────────────────────┐
│ Determine the random command according to a state machine   │── S402
│ module and a current state                                  │
└─────────────────────────────────────────────────────────────┘
                              │
                              ▼
┌─────────────────────────────────────────────────────────────┐
│ Perform functional testing on a memory cell corresponding to│── S403
│ the random address, based on the random command             │
└─────────────────────────────────────────────────────────────┘
``` ing to the current state, to generate a random command sequence.

19 Claims, 7 Drawing Sheets

(51) Int. Cl.
  *G06F 11/263* (2006.01)
  *G11C 29/18* (2006.01)
  *G11C 29/44* (2006.01)
  *G11C 29/46* (2006.01)
  *G01R 31/3181* (2006.01)

(52) U.S. Cl.
  CPC .......... *G11C 29/4401* (2013.01); *G11C 29/46* (2013.01); *G01R 31/31813* (2013.01)

(56) References Cited

U.S. PATENT DOCUMENTS

| | | | |
|---|---|---|---|
| 2013/0290621 A1* | 10/2013 | Wang | G06F 13/1631 |
| | | | 711/106 |
| 2018/0246796 A1* | 8/2018 | Pappu | G06F 11/221 |
| 2020/0301798 A1 | 9/2020 | Cardoso et al. | |

FOREIGN PATENT DOCUMENTS

| | | |
|---|---|---|
| CN | 111326205 A | 6/2020 |
| CN | 112433762 A | 3/2021 |
| EP | 0342805 B1 | 8/1995 |

OTHER PUBLICATIONS

Yang et al, Random pattern generation for Post-Silicon validation of DDR3-SDRAM, IEEE, pp. 1-6. (Year: 2015).*

* cited by examiner

METHOD AND DEVICE FOR GENERATING COMMAND SEQUENCE, METHOD AND DEVICE FOR TESTING, AND STORAGE MEDIUM

CROSS-REFERENCE TO RELATED APPLICATIONS

This is a continuation of International Application No. PCT/CN2022/086597, filed on Apr. 13, 2022, which claims priority to Chinese patent application No. 202210337896.7, filed on Mar. 31, 2022 and entitled "METHOD AND DEVICE FOR GENERATING COMMAND SEQUENCE, METHOD AND DEVICE FOR TESTING, AND STORAGE MEDIUM". The disclosure of International Application No. PCT/CN2022/086597 and Chinese patent application No. 202210337896.7 are hereby incorporated by reference in their entireties.

TECHNICAL FIELD

The present disclosure relates to the technical field of semiconductor, in particular to a method and device for generating a command sequence, a method and device for testing, and a storage medium.

BACKGROUND

With development of the semiconductor technology, the requirements for the data transmission rate is increasingly high. In order to achieve a greater data transmission rate, a series of memory devices have been developed in which data can be transmitted at Double Data Rate (DDR).

In a Dynamic Random Access Memory (DRAM), for small-scale circuits, it is now possible to test certain functions directionally by writing separate stimulation files. However, as the design grows larger and the number of functions grows in multiples, it becomes very difficult to check all the functions completely, and some unexpected bugs often exist in jumps and interactions between certain specific functions, which is difficult to find only through directional stimulation testing.

SUMMARY

According to a first aspect, embodiments of the present disclosure provide a method for generating a command sequence, which may include the following operations.

At least one executable Command (CMD) is determined based on a state machine module according to a current state.

At least one command weight corresponding to at least one executable CMD is acquired, and a random command is generated from the at least one executable CMD by taking the at least one command weight as a constraint condition.

According to a second aspect, the embodiments of the present disclosure provide a method for testing a command sequence, which may include the following operations.

A to-be-tested random command sequence is determined. Herein, the random command sequence includes a plurality of command sequence units, and each command sequence unit is composed of a random command and a random address.

The random command is determined according to a state machine module and a current state.

Functional testing is performed on a memory cell corresponding to the random address based on the random command.

According to a third aspect, the embodiments of the disclosure provide a semiconductor device, which may include a memory and a processor.

The memory is configured to store a computer program capable of running in the processor.

The processor is configured to execute the method according to the first aspect or the method according to the second aspect when running the computer program.

According to a fourth aspect, the embodiments of the disclosure provide a computer readable storage medium. A computer program is stored in the computer readable storage medium. The computer program is executed to implement the method according to the first aspect or the method according to the second aspect.

DETAILED DESCRIPTION

Figure 1:
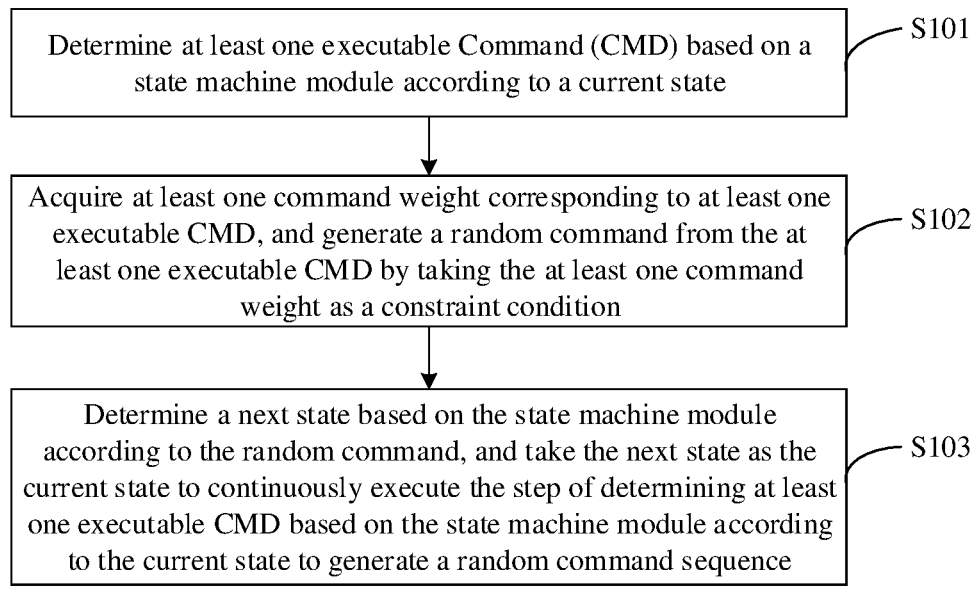
FIG. 1 is a flowchart of a method for generating a command sequence according to an embodiment of the disclosure.

Technical solutions in the embodiments of the disclosure are clearly and completely described below in combination with the drawings in the embodiments of the disclosure. It can be understood that the specific embodiments described herein are merely illustrative of the disclosure and are not intended to limit the disclosure. In addition, it is also to be noted that, for ease of description, only the parts related to the relevant disclosure are shown in the drawings.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

Dynamic Random Access Memory (DRAM) has the advantages of high access speed, high storage density and low unit memory cell cost, and is widely used in the main memory of computers. With the rapid development of DRAM technology, DDR has developed from DDR1, DDR2, DDR3 and DDR4 to DDR5. With the continuous progress of computer capabilities, memory devices are being pushed to the direction of higher performance.

It is to be understood that for small-scale circuits, certain functions may be now directionally tested by writing separate stimulation files. However, as the design grows larger and the number of functions grows in multiples, it becomes very difficult to check all the functions completely, and some unexpected bugs often exist in jumps and interactions between these specific functions, which is difficult to find only through directional stimulation testing. Therefore, it is necessary to use constraint random testing.

Specifically, by modifying the data flow of directional testing, some bit-level bugs, that is, bugs on a data-path, may be detected, while the control-level bugs, which are often more deadly, can be checked randomly through the sequence level of the random constraint testing. In addition, it is very important to perform high coverage check of the multi-state jump paths of DRAM products.

However, in the related art, it is inefficient to perform simple stimulation of directional testing through manual check. After a random constraint testing platform is built, hundreds of tests may be performed at the same time, and the automatic check is more efficient. However, for generation of an instruction sequence, if a legal sequence is generated based on randomness between combinations, the coverage is relatively low.

Based thereon, the embodiments of the disclosure provide a method for generating a command sequence. The basic idea of the method is that: at least one executable CMD is determined based on a state machine module according to a current state; at least one command weight corresponding to at least one executable CMD is acquired, and a random command is generated from the at least one executable CMD by taking the at least one command weight as a constraint condition to; a next state is determined based on the state machine module according to the random command, and the next state is taken as the current state to continuously execute the step of determining at least one executable CMD based on the state machine module according to the current state, to generate a random command sequence. Thus, since the generation of the random command sequence can be minimized to the single command-single command level, the randomness of command transmission is higher, so that when testing is performed according to the random command sequence, the functional testing coverage of the DRAM products is improved.

Various embodiments of the present disclosure will now be described in detail in combination with the accompanying drawings.

In an embodiment of the disclosure, referring to FIG. 1, FIG. 1 is a flowchart of a method for generating a command sequence according to an embodiment of the disclosure. As shown in FIG. 1, the method may include the following operations.

At S101, at least one executable CMD is determined based on a state machine module according to a current state.

It is to be noted that the embodiment of the present disclosure provides a digitally verified random sequence generator, which particularly relates to the generation of random command sequences of DRAM products. Here, in order to ensure the accuracy of data reading and writing of the DRAM products, a random test file written during digital verification needs to improve the coverage of functional testing as much as possible.

Specifically, the embodiment of the present disclosure may determine at least one executable CMD according to the state machine module and the current state. Then, by performing command weight and legal constraint on the at least one executable CMD, it can be applied to generating a random command sequence with high coverage, and key testing of main functions may be implemented by setting the weights of different commands. For example, the weight of a refreshing command is set higher, so that the test times of the refreshing command may be increased within a limited time, and then the test efficiency is improved.

It is also to be noted that in the embodiment of the disclosure, the state machine module may be regarded as a directed graph, which is composed of a group of nodes and a group of corresponding transfer functions. It "runs" in response to a series of events, and can perform state jump in accordance with a preset state according to a control signal. Here, when the state machine module is described, the following key elements need to be clearly described: how to perform state jump, what is the output of each state, the condition for state jump, etc.

In some embodiments, before the at least one executable CMD is determined according to the state machine module, the method may further include the following operations.

Functional description and modeling are performed on a plurality of commands to obtain a plurality of executable CMDs.

At least two states of the state machine module are determined.

A state jump relationship of the state machine module is built based on the at least two states and the plurality of executable CMDs.

It is to be noted that the state machine module in the embodiment of the disclosure includes elements such as respective command weights of the plurality of executable CMDs, at least two states, and the executable CMDs which are used to trigger the state jump relationship.

It is also to be noted that, in the embodiment of the present disclosure, for the state machine module, the state jump relationship may be described by a state jump diagram. Herein, in the state jump diagram, the state jump relationship may include the respective command weights of the plurality of executable CMDs. The executable CMDs are used to trigger a first state to jump to a next state, and the first state is any one of the at least two states. Herein, the command weight here may be preset according to a certain strategy. Exemplarily, setting may be performed according to an experience value, or setting may be performed according to the degree of emphasis of command functions. If a read/write function is more emphasized, the command weight of a read-write command is set higher. Even the command weight of at least one executable CMD corresponding to each state may also be determined according to a computing mechanism, which is not specifically limited in the embodiment of the present disclosure.

That is, in the embodiment of the present disclosure, firstly, function description, modeling operation, etc. may be performed on a plurality of commands according to a technical specification (spec), to determine a plurality of executable CMDs. Secondly, all the states of a DRAM may be defined according to the spec, such as an Idle state, a Read state, a Write state, a Mode Register Read (MRR) state, etc. Then, according to the at least two states and the plurality of executable CMDs, the state jump relationship of the spec can be built. Thirdly, legal jump paths between different states may be described according to the state jump relationship of the spec.

Specifically, if the current state is taken as the first state, the current state is first determined, and then at least one executable CMD that triggers the current state to perform state jump is determined; and all executable CMDs are subjected to weight setting and weight constraint, so as to build the state jump relationship of the state machine module.

Thus, at least one executable CMD may be obtained based on the state jump relationship of the state machine module in the case that the current state is determined.

At S102, at least one command weight corresponding to at least one executable CMD is acquired, and a random command is generated from the at least one executable CMD by taking the at least one command weight as a constraint condition.

In some embodiments, the operation of acquiring at least one command weight corresponding to the at least one executable CMD may include that: the at least one command weight corresponding to the at least one executable CMD is acquired from the respective command weights of the plurality of executable CMDs based on the state jump relationship.

That is, in the embodiment of the present disclosure, based on the state jump relationship of the spec, at least one executable CMD corresponding to the current state may be acquired. Then, the at least one command weight corresponding to the at least one executable CMD is acquired from the respective known command weights of the plurality of executable CMDs. In a specific implementation, a command weight is actually a probability weight, so for at least one executable CMD corresponding to the current state, the sum of the at least one command weight corresponding to the at least one executable CMD may be equal to 1.

Thus, after the at least one command weight is acquired, the at least one command weight is taken as a constraint condition so that a random command can be generated from the at least one executable CMD.

In some embodiments, the method may further include that: at least one executable CMD for triggering the current state to jump is selected from the plurality of executable CMDs as a legal command(s) corresponding to the current state.

Accordingly, the operation of acquiring at least one command weight corresponding to at least one executable CMD, and generating a random command from the at least one executable CMD by taking the at least one command weight as a constraint condition may include that: a command weight(s) corresponding to the legal command(s) is/are acquired, and the random command is generated by jointly taking the command weight(s) and the legal command(s) as a constraint condition.

Figure 2:
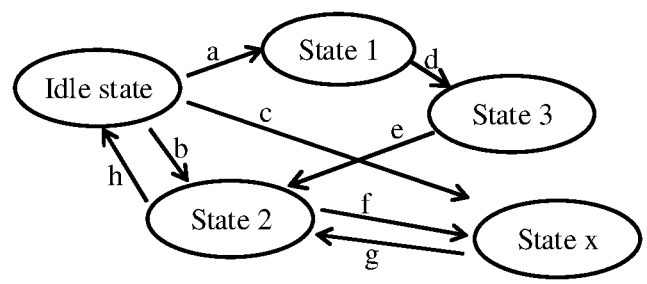
FIG. 2 is a schematic diagram I of a jump relationship of a state machine module according to an embodiment of the disclosure.

Exemplarily, referring to FIG. 2, which is a schematic diagram of a jump relationship of a state machine module according to an embodiment of the disclosure. As shown in FIG. 2, the state machine module may include an idle state, a state 1, a state 2, a state 3 and a state x, and may further include eight executable CMDs such as a, b, c, d, e, f, g and h. Herein, for the idle state, the executable CMDs that can trigger the idle state to jump are a, b and c. That is, the legal commands corresponding to the idle state are only a, b and c. After the command weights corresponding to a, b, and c are acquired, the random command may be generated from the three commands according to the command weights and legal commands jointly as the constraint condition. For example, the random command may be a, b, or c.

Thus, during generation of the random command, the command occurrence probability is jointly constrained according to the command weight(s) and the legal command(s), so that the command is transmitted more randomly, and the jump between various states is more flexible, thus improving the coverage of functional testing.

At S103, a next state is determined based on the state machine module according to the random command, the next state is taken as the current state to continuously execute the step of determining at least one executable CMD based on the state machine module according to the current state, to generate a random command sequence.

It is to be noted that after the random command is generated, the next state may be determined according to the state jump relationship, the current state and the random command of the state machine module. Then, the next state is taken as the current state of a new round, returning to execute S101 again, so that the random command sequence can be generated.

Exemplarily, still taking FIG. 2 as an example, the state machine module may include an idle state, a state 1, a state 2, a state 3 and a state x, and may further include eight executable CMDs such as a, b, c, d, e, f, g and h. Herein, in the case where the current state is the idle state, the corresponding executable CMDs at this time include a, b and c. If the random command generated under the joint constraint of the command weight(s) and the legal command(s) is b, the next state of the current state to jump to is state 2. That is, the state 2 may be used as the current state of the new round. At this time, the corresponding executable CMDs include f and h. If the random command generated under the joint constraint of the command weight(s) and the legal command(s) is f, the next state of the current state to jump to is state x. That is, the state x may be used as the current state of a new round, and the random command sequence is generated accordingly.

Here, since the state jump relationship is configured to describe the legal jump paths between different states, the generated command sequence can have higher randomness and wider coverage according to the state jump relationship, and the command weight(s) and legal command(s) as the constraint condition.

Furthermore, the embodiment of the present disclosure may also set an address weight for the memory address to be accessed by the random command, to generate a random address. Therefore, in some embodiments, the method further includes the following operations.

A plurality of memory addresses to be accessed by the random command are acquired.

Address weights are set, each for a respective one of the plurality of memory addresses, and a random address is generated by taking the address weights as a constraint condition. Herein, the random command is configured to access the random address and perform functional testing.

It is to be noted that in the embodiment of the present disclosure, different memory addresses correspond to different memory cells. Herein, the memory address is accessed through the random command, so that functional testing can be performed on the memory cell corresponding to the memory address.

It is still to be noted that in the embodiment of the disclosure, one random command sequence may include a plurality of command sequence units. Herein, each command sequence unit is composed of a random command and a random address.

Thus, after the random command is generated according to the state machine module, the plurality of memory addresses to be accessed by the random command may be acquired. Then, according to the address weights as a constraint condition, a random address is generated from the plurality of memory addresses, which may not only check the correctness of circuit functions such as decoding, amplification and error correction of a memory cell as much as possible, but also reduce the probability that the same command will access the same memory address next time.

In some embodiments, the memory addresses may include a first type of address(es) and a second type of address(es). The operation of setting address weights, each for a respective one of the plurality of memory addresses may include the following operations.

A first weight value is set for the first type of address(es) among the plurality of memory addresses, and a second weight value is set for the second type of address(es) among the plurality of memory addresses.

Herein, the first type of address(es) represent(s) an address(es) that has/have not been accessed by the random command, the second type of address represents an address(es) that has/have been accessed by the random command, and the first weight value is greater than the second weight value.

That is, a relatively small weight value may be set for the second type of address(es) that has/have been accessed by the random command A relatively large weight value may be set for the first type of address(es) that has/have not been accessed by the random command Therefore, in the next accessing operation, an address that has not been accessed may be accessed preferentially, and the probability that the random command accesses the same memory address next time is reduced. It is to be understood that at the beginning, all addresses belong to the first type of addresses, and with the increase of the number of accesses, the number of the second type of addresses will gradually be increased, while the number of the first type of addresses will be decreased.

It is also to be noted that, in the embodiment of the present disclosure, a Normal addr refers to a normal address without defects, and a Redundant addr refers to some redundant rows or columns that exist physically. Since the DRAM has defects in manufacturing, for example, some rows or columns are damaged, it is necessary to use the redundant address to replace the demaged rows or columns at this time. In addition, a repeat address refers to the second type of address that has been accessed, which is different from the redundant address. Moreover, access to the repeat address may be reduced in the next accessing operation or the address is not accessed.

For the first type of address(es), in a specific embodiment, the first type of address(es) may include a normal address and a redundant address. Correspondingly, the operation of setting a first weight value for the first type of address(es) among the plurality of memory addresses may include the following operations.

A first primary-weight value is set for the normal address in the first type of address(es), and a first secondary-weight value is set for the redundant address in the first type of address(es). Herein, the first primary-weight value is greater than the first secondary-weight value.

Here, the first type of address(es) that has/have not been accessed may be divided into the normal address and redundant address. Herein, the weight value set for the normal address needs to be larger than the weight value set for the redundant address, so as to implement primary and secondary accesses to the memory cells corresponding to the normal address and the redundant address, and the normal address, as the main memory, needs a larger weight value. In some embodiments, the weight of the redundant address may be set to 0, so that a defective memory cell can be detected, which facilitate replacing it with a redundant memory cell in time.

For the second type of address(es), in another specific embodiment, the second type of address(es) may also include a normal address and a redundant address. Correspondingly, the operation of setting a second weight value for the second type of address(es) among the plurality of memory addresses may include that: a second primary-weight value is set for the normal address in the second type of address, and a second secondary-weight value is set for the redundant address in the second type of address. However, in order to give priority to the addresses that have not been accessed next time, it is necessary to dynamically adjust the address weight of the second type of address(es). If a normal address has been accessed by a certain random command, the second primary-weight value corresponding to the normal address will still be appropriately reduced when the normal address is executed by the same command for the accessing operation again. That is, after the address weight of the second type of address is dynamically adjusted for many times, the weight value set for the normal address may not be greater than the weight value set for the redundant address. In addition, the first primary-weight value is greater than or equal to the second primary-weight value, and the first secondary-weight value is greater than or equal to the second secondary-weight value.

Furthermore, for the generated random address, if the random address is accessed by the random command, the random address needs to be recorded at this time. Therefore, in some embodiments, the method may further include that: after the random address is accessed by the random command, it is determined that the random address is a second type of address corresponding to the random command.

The random address is stored in an address record table. Herein, the address record table is configured to record the second type of address that has been accessed by the random command.

In some embodiments, the method may further include that: when the random command executes the accessing operation on a second type of address stored in the address record table again, the address weight of the second type of address stored in the address record table is dynamically adjusted so as to reduce the second weight value of the second type of address.

It is to be noted that after the generated random address is accessed by the random command, the random address which is taken as an address that has been accessed, may be stored into the address record table. In the embodiment of the present disclosure, different random commands correspond to different address record tables. That is, an address record table is correspondingly set for each random command Thus, for a certain random command, the address that has been accessed is recorded, and the weight value can be dynamically reduced, so that the probability that the random command accesses the same address next time can be reduced, the address that has not been accessed may be preferentially accessed next time, and different functional testing may be performed on different addresses.

In some embodiments, the type of the random command sequence is a single command-single command type.

It is to be noted that the functional testing may include a directional testing sequence and a random constraint testing sequence, and the random constraint testing sequence may include a combined command sequence and a single command sequence. Herein, the type of the directional testing sequence is a fixed combination type, the type of the combined command sequence is a combination-combination type, and the type of the single command sequence is a single command-single command type. Exemplarily, a directional testing sequence is: ②③①⑤④⑥-②③①⑤④⑥-②③①⑤ ④⑥-.... The combinations here are all the same, and the internal order within each combination is fixed.

A combined command sequence is (taking two combinations ②③, ①⑤④⑥ as an example): ②③-①⑤④⑥-②③-①⑤④⑥-①⑤④⑥-① ⑤④⑥-②③-②③-C.... There may be multiple different combinations (for example, (②③ and ①⑤④⑥), but the internal order within each combination is fixed as well. In addition, for the combined command sequence, the more complete a combination library is, the better the effect can be achieved. But in fact, the combination library is difficult to be complete, and each combination has a high human intervention component.

A single command sequence is: ②-⑤-④-①-④-⑥-②-③-①-③-③-⑥-②-①-.... The single command sequence is composed of single commands, which uses the least human intervention, meets the spec, and has high randomness. Therefore, the principle is very simple. That is, the spec needs to be met at the same time of high randomness.

It is to be seen that simple stimulation of directional testing needs manual check, and is thus inefficient. After a test platform for the random constraint test is built, hundreds of tests may be performed at the same time, and automatic check is achieved with higher efficiency. However, for the generation of the command sequence, if a legal sequence of the combination-combination type is generated randomly, the coverage is relatively low. Therefore, in order to improve the coverage as much as possible, the embodiment of the present disclosure minimizes the generation of the random command sequence to the level based on single command-single command, so that the testing efficiency may be improved. In addition, it is assumed that a command sequence ⑥-② needs to be tested, and if the combination-combination type is adopted, a "①⑤④⑥-②③" combined command sequence needs to be tested completely. However, if the single command-single command type is adopted, testing of ⑥-② may be directly implemented, which can save time and increase the number of tests of the command sequence within a limited time, so that more memory cells can be covered and tested. Meanwhile, compared with the combination-combination type, the single command-single command level involves a wider state jump relationship. For example, assuming that the command sequence ④-② needs to be tested, for the above-mentioned method for generating a command sequence of a combination-combination type, there is no such jump, so it is impossible to check whether there is any problem in the jump process.

Figure 3:
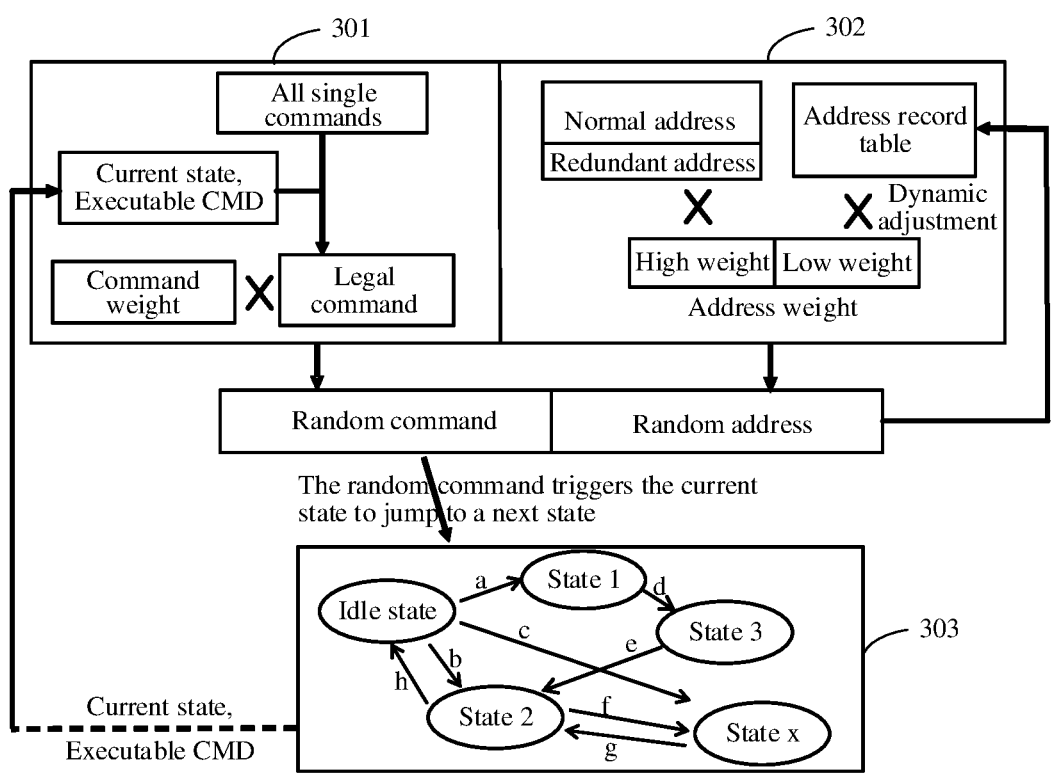
FIG. 3 is a schematic diagram of an application architecture of a method for generating a command sequence according to an embodiment of the disclosure.

In another embodiment of the disclosure, referring to FIG. 3, FIG. 3 is a schematic diagram of an application architecture of a method for generating a command sequence according to an embodiment of the disclosure. As shown in FIG. 3, the application architecture may include: a random command generation module 301, a random address generation module 302, and a state machine module 303.

The random command generation module 301 mainly includes a current state, an executable CMD(s) corresponding to the current state, all single commands, command weights, a legal command(s) and other key elements. Herein, the current state and the executable CMD(s) corresponding to the current state are provided by the state machine module 303. Then, the legal command(s) is/are determined according to a command intersection of the executable CMD(s) corresponding to the current state and all single commands. Then, according to the command weight(s) and the legal command(s) as a constraint condition, a random command is generated from the legal command(s).

The random address generation module 302 mainly includes key elements such as the first type of address(es), the second type of address(es) and the address weight(s). Herein, the first type of address(es) include(s) a normal address and a redundant address, and the second type of address needs to be stored in the address record table as the already accessed address. Among the address weights, the first type of address is given a high weight, and the second type of address(es) in the address record table is given a low weight. Herein, the high weight and low weight mean that the weight of the normal address in the first type of address(es) is greater than the weight of the normal address in the second type of address(es), and the weight of the redundant address in the first type of address(es) is greater than or equal to the weight of the redundant address of the second type of address(es). In addition, according to the address weight(s) as a constraint condition, a random address may be generated. Then, after the random command accesses the random address, the random address may be placed in the address record table as the second type of address, and the weight of the second type of address stored in the address record table will be dynamically adjusted.

The state machine module 303 may include a plurality of states (for example, an idle state, a state 1, a state 2, a state 3 and a state x) and a plurality of executable CMDs (for example, a, b, c, d, e, f, g, h, etc.) After the random command is obtained, the next state to jump to may be determined according to the current state, then the next state is taken as the current state of a new round, and the current state and the corresponding executable CMD(s) are transmitted to the random command generation module 301.

It is to be understood that with reference to FIG. 3, the generation of the random command comes from the state machine module 303 defined by the spec. Specifically, according to the state machine module 303 defined by the spec, legal commands corresponding to the current state (that is, executable CMDs that may be selected in the current state) may be acquired; and then a command is generated randomly based on the command weight(s) corresponding to the legal command(s; and the randomly generated commands enable the current state to jump to the next state, and the next state at this time is taken as the current state of a new round. Exemplarily, assuming that the current state is an idle state, and the corresponding legal commands are a, b and c, assuming that the generated random command is b according to the joint constraint of the command weight(s)

and legal command(s), the next state that the current state jumps to is state 2. That is, the state 2 may be taken as the current state of a new round.

It is also to be understood that with reference to FIG. 3, the generation of the address command requires the to-be-tested addresses to be divided into a normal address and a redundant address. Herein, the normal address, as the main memory, needs to be set a larger weight, so as to check the correctness of the circuit functions such as decoding, amplification and error correction of cell as much as possible. The already accessed addresses are recorded and the weight thereof can be dynamically reduced, thus reducing the probability that the same command accesses the same address next time.

Through detailed description of above-mentioned embodiment on specific implementation of the foregoing embodiments, it is to be seen therefrom that according to the technical solution of the foregoing embodiments, a digitally verified random sequence generator is mainly provided here, especially relating to the generation of a DRAM random command sequence. The probability of occurrence of single (piece) command is optimized by adjusting the weight, and the legality of transmission of the command sequence is constrained according to requirements of the spec, which may be applied to generating random command sequences with higher coverage. Moreover, different addresses are assigned different weights, and the weights of the already accessed addresses are dynamically adjusted, so that in the next accessing operation, the addresses that are not accessed may be accessed preferentially, and the probability that the same command accesses the same memory address next time is reduced.

Figure 4:
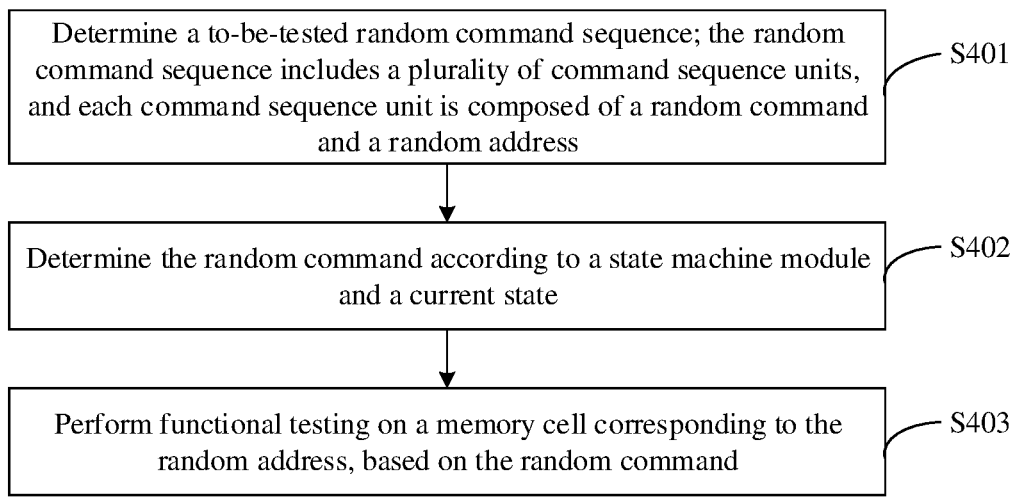
FIG. 4 is a flowchart of a method for testing a command sequence according to an embodiment of the disclosure.

In yet another embodiment of the disclosure, referring to FIG. 4, FIG. 4 is a flowchart of a method for testing a command sequence according to an embodiment of the disclosure. As shown in FIG. 4, the method may include the following operations.

At S401, a to-be-tested random command sequence is determined. Herein, the random command sequence includes a plurality of command sequence units, and each command sequence unit is composed of a random command and a random address.

It is to be noted that in the embodiment of the disclosure, the to-be-tested random command sequence may be obtained by the method for generating the command sequence according to the foregoing embodiments.

It is also to be noted that in the embodiment of the disclosure, since the random command sequence is of a single command-single command type, which enables the coverage to be improved. That is, the command is transmitted more randomly, and more combinations can be generated for one sequence. For example, assuming that a single command sequence is: (2)-(5)-(4)-(1)-(4)-(6)-(2)-(3)-(1)-(3)-(3)-(6)-(2)-(1)- . . . combined command sequences such as (2)(5)(4), (1)(4)(6)(2), (3)(1)(3)(3)(6)(2)(1), or (2)(5), (4)(1)(4)(6)(2), (3)(1)(3)(3)(6)(2)(1), or (2)(5)(4)(1), (6)(6)(2)(3)(1), (3)(3)(6)(2)(1), etc. may be generated.

At S402, the random command is determined according to a state machine module and a current state.

It is to be noted that in some embodiments, the operation of determining the random command according to the state machine module and the current state may include the following operations.

At least one executable CMD is determined based on state machine module according to the current state.

At least one command weight corresponding to the at least one executable CMD is acquired, and a random command is generated from the at least one executable CMD by taking the at least one command weight as a constraint condition.

In the embodiment of the disclosure, for the state machine module, functional description and modeling may be performed on a plurality of commands to obtain a plurality of executable CMDs; then at least two states of the state machine module are determined; and accordingly, a state jump relationship of the state machine module may be built based on the at least two states and the plurality of executable CMDs. Herein, the state jump relationship may include the respective command weights of the plurality of executable CMDs, and the executable CMDs are used to trigger the current state to jump to a next state.

It is to be noted that the command weight here may be preset according to a certain strategy. Exemplarily, setting may be performed according to an experience value, or setting may be performed according to the degree of emphasis of command functions. If a read-write function is more emphasized, the command weight of a read-write command is set higher. Even the at least one command weight of at least one executable CMD corresponding to each state may also be determined according to a computing mechanism, which is not specifically limited in the embodiment of the present disclosure.

Exemplarily, taking FIG. 2 as an example, for the to-be-tested random command sequence, in the case where current state is an idle state, the corresponding executable CMD at this time includes a, b and c. Then, after the command weights corresponding to a, b, and c are acquired, the random command may be generated from these three commands according to the command weights as a constraint condition. For example, the random command may be a, or b, or c.

In some embodiments, the method may further include that, at least one executable CMD for triggering the current state to jump is selected from the plurality of executable CMDs as a legal command corresponding to the current state.

Accordingly, the operation of acquiring at least one command weight corresponding to at least one executable CMD, and generating a random command from the at least one executable CMD by taking the at least one command weight as a constraint condition may include that: a command weight(s) corresponding to the legal command(s) is/are acquired, and the random command is generated by jointly taking the command weight(s) and the legal command(s) as a constraint condition.

That is, for the to-be-tested random command sequence, the embodiment of the present disclosure may determine at least one executable CMD according to the state machine module and the current state. Then, command weight(s) and legality constraint are performed on the at least one executable CMD to generate the random command Thus, since the commands in the random command sequence are transmitted more randomly, the coverage of functional testing can be improved.

It is also to be noted that the state machine module includes a plurality of states and executable CMD(s) corresponding to each state. In some embodiments, the method may further include the following operations.

A next state is determined based on the state machine module according to the random command.

The next state is taken as the current state to continuously execute the step of determining at least one executable CMD based on the state machine module according to the current state, to generate a next random command.

In the embodiment of the disclosure, after the random command is generated according to the current state, a next state of the current state may be determined according to the random command and the state machine module, so as to proceed with a new round of generation of random commands Exemplarily, still taking FIG. 2 as an example, in the case where the current state is an idle state, the corresponding executable CMDs at this time include a, b and c, and then the random command generated under the joint constraint of the command weight(s) and the legal command(s) is b. At this time, the next state that the current state jumps to is state 2. That is, state 2 may be taken as the current state of the new round, and then the random command generated under the joint constraint of the command weight(s) and legal command(s) is f, and so on until all commands in the to-be-tested random command sequence have been traversed.

Thus, in the case where the current state is determined, at least one executable CMD and the at least one command weight corresponding to the at least one executable CMD may be obtained based on the state jump relationship of the state machine module. Then, the command occurrence probability is constrained according to the command weight(s) and legality, so that the commands in the random command sequence are transmitted more randomly, and the command weights need to be set correspondingly before the test. In order to increase the number of tests of main functions within a limited time, the command weight values corresponding to the tests of the main functions may be set higher to improve the testing efficiency.

At S403, functional testing is performed on a memory cell corresponding to the random address based on the random command.

It is to be noted that different memory addresses correspond to different memory cells. Herein, the memory address is accessed through the random command, so that functional testing can be performed on the memory cell corresponding to the memory address. Therefore, in some embodiments, before functional testing is performed on a memory cell corresponding to the random address based on the random command, the method may further include the following operations.

A plurality of memory addresses to be accessed by the random command are acquired.

Address weight are set, each for a respective one of the plurality of memory addresses, and a random address is generated by taking the address weights as a constraint condition.

The random address is accessed according to the random command, so as to execute the step of performing functional testing on the memory cell corresponding to the random address.

That is, after the random command is generated according to the state machine module, the plurality of memory addresses to be accessed by the random command may be acquired. Then, according to the address weight as a constraint condition, the random address is generated from the plurality of memory addresses, and access to the random address according to the random command may implement performing functional testing on the memory cell corresponding to the random address, so that not only primary and secondary accesses to the memory cells can be achieved, but also the correctness of circuit functions such as decoding, amplification and error correction of memory cells can be checked as much as possible.

In some embodiments, the memory addresses include a first type of address(es) and a second type of address(es). The operation of setting address weights, each for a respective one of the plurality of memory addresses may include the following operations.

A first weight value is set for the first type of address(es) among the plurality of memory addresses, and a second weight value is set for the second type of addresses among the plurality of memory addresses.

Herein, the first type of address(es) represent(s) an address that has not been accessed by the random command, the second type of address(es) represent(s) an address that has been accessed by the random command, and the first weight value is greater than the second weight value.

That is, a relatively small weight value may be set for the second type of address(es) that has/have been accessed by the random command A relatively large weight value may be set for the first type of address(es) that has/have not been accessed by the random command Therefore, in the next accessing operation, the address(es) that has/have not been accessed may be accessed preferentially, and the probability that the same command accesses the same memory address next time is reduced.

It is also to be noted that for the first type of address(es), the first type of address(es) may include a normal address and a redundant address. Correspondingly, the operation of setting a first weight value for the first type of address(es) among the plurality of memory addresses may include that: a first primary-weight value is set for the normal address in the first type of address(es), and a first secondary-weight value is set for the redundant address in the first type of address(es). Herein, the first primary-weight value is greater than the first secondary-weight value.

It is also to be noted that for the second type of address, the second type of address may also include a normal address and a redundant address. Correspondingly, the operation of setting a second weight value for the second type of address among the plurality of memory addresses may include that: a second primary-weight value is set for the normal address in the second type of address(es), and a second secondary-weight value is set for the redundant address in the second type of address(es). Herein, the first primary-weight value is greater than or equal to the second primary-weight value, and the first secondary-weight value is greater than or equal to the second secondary-weight value.

That is, the second type of address(es) that has/have been accessed may also be divided into a normal address and a redundant address. However, in order to give priority to the address(es) that has/have not been accessed next time, it is necessary to dynamically adjust the address weight of the second type of address(es). If the normal address has been accessed by a certain random command, the second primary-weight value corresponding to the normal address will still be appropriately reduced when the normal address is executed by the same command for the accessing operation again. That is, after the address weight of the second type of address(es) is dynamically adjusted for many times, the weight value set for the normal address may not be greater than the weight value set for the redundant address.

Furthermore, in some embodiments, the method may further include that: after the random address is accessed by the random command, it is determined that the random address is the second type of address corresponding to the random command; and the random address is stored in an address record table. Herein, the address record table is configured to record the second type of address that has been accessed by the random command.

It is to be noted that in the embodiment of the present disclosure, different random commands correspond to different address record tables. That is, an address record table is correspondingly set for each random command.

It is also to be noted that in some embodiments, the method may further include that: when the random command executes the accessing operation on the second type of address stored in the address record table again, the address weight of the second type of address stored in the address record table is dynamically adjusted so as to reduce the second weight value of the second type of address. Thus, the address that has been accessed is recorded, and the weight value can be dynamically reduced, so that the probability that the same command accesses the same address next time can be reduced, the addresses that have not been accessed may be preferentially accessed next time, and different functional testing may be performed on different addresses.

In brief, in the embodiment of the present disclosure, according to the technical solution of the foregoing embodiments, in order to ensure the accuracy of data reading and writing of DRAM products, a random test file compiled during digital verification can improve the coverage of functional testing as much as possible; and the generation of the random command sequence is minimized to the level based on single command-single command Specifically, constraining is performed according to the state jump relationship of the spec in combination with the current state and a next executable legal command Meanwhile, the probability of occurrence of commands is constrained using the weight. In addition, a certain weight may also be set for an address (including a normal address and a redundant address) executed by a command for an accessing operation, and the weight of a repeat address may be dynamically adjusted. Thus, by setting the weights of different commands to achieve key testing on the main functions, and by setting the weights of different addresses to achieve the primary and secondary accesses to the memory cell, and reducing the probability that the same command accesses the same memory address next time, testing on more memory cells may be covered, thereby improving the testing efficiency.

In a specific embodiment, the following steps are included.

At S1, functional description, modeling, etc. are performed on each command according to spec.

At S2, all the states of a DRAM (such as an Idle state, a Read state, a Write state, an MRR state, etc.) are defined according to the spec.

At S3, a random address generation module is configured for a command access operation in step 4, including the following operations.

(1) Weight for address access is set.

(2) The already accessed address is recorded, and the address that has not been accessed is preferentially accessed next time (dynamic adjustment of the weight is performed).

At S4, according to the state jump relation of the spec, a legal jump path between states is described, which includes the following operations.

(1) A current state.

(2) An executable CMD that triggers state jump.

(3) Command weights are set for all commands, and weight constraint is performed.

Thus, in the embodiment of the present disclosure, aiming at the improvement of coverage, exemplarily, for a system with five commands, the random command sequence has 10 commands in length, which are pairwise generated into command combinations. At this time, there are at most $C_5^2 C_5^2 C_5^2 C_5^2 C_5^2 = 10^5$ cases for a sequence having a length of 10. For a random command sequence of the single-command-single-command type, there are at most $C_5^1 C_5^1 C_5^1 C_5^1 C_5^1 C_5^1 C_5^1 C_5^1 C_5^1 C_5^1 = 5^{10}$ cases for the sequence at this time. Even though there are some illegal state jumps, the random command sequence of the combination-combination type belongs to a subset of the random command sequence of the single command-single command type, and the illegal state jumps appearing in the single command-single command type may also be avoided by setting the command weights.

It is to be seen that, the number of legal sequences of single command-single command type is greater than or equal to the number of legal sequences of combination-combination type. For the way of a command set of the combination-combination type, there is a problem of insufficient support for some test requirements. Specifically, if a designed command set is not complete enough, the coverage test of 3 commands can only be completed by 2×2=4 commands, resulting in redundancy or repeat testing. For example, assuming that two combined command sets ②③, ①⑤④⑥ exist, if requiring a random command sequence ③-①-⑤-④-⑥-② (the number of execution commands is 6), ②③-①⑤④⑥-②③ need to be transmitted, and the number of execution commands is actually 8, thus resulting in redundancy or repeat testing.

Figure 5:
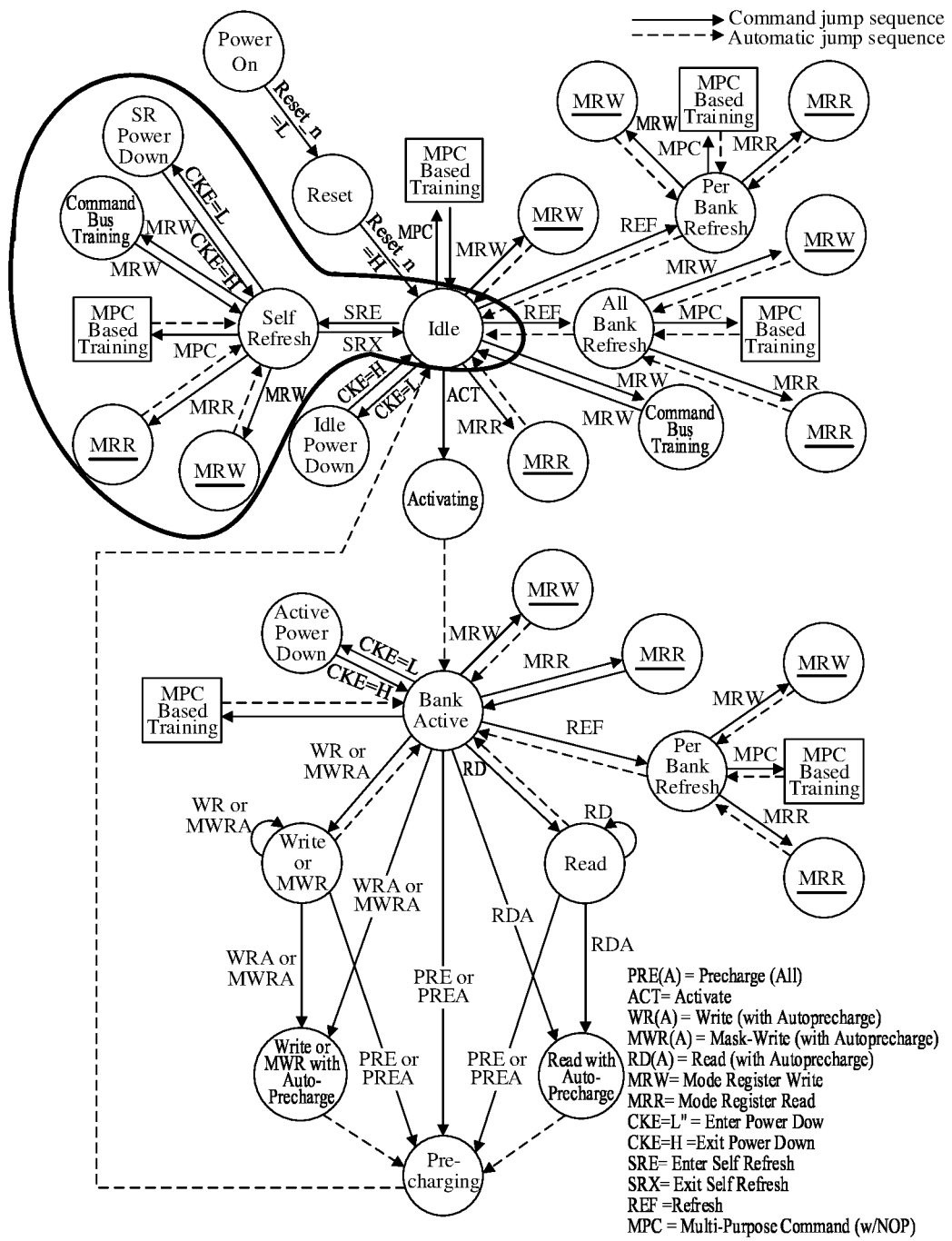
FIG. 5 is a schematic diagram II of a jump relationship of a state machine module according to an embodiment of the disclosure.

Exemplarily, referring to FIG. 5, FIG. 5 is a schematic diagram of a state jump relationship according to an embodiment of the disclosure. As shown in FIG. 5, this is a state jump diagram (the whole structure is called a state machine module) defined in spec of Low Power (LP) DDR4. Herein, a circle indicates the state, that is, during the execution of the command A solid line is a specific command that is transmitted (a condition that triggers state jump). A dotted line refers to automatic jump to a certain state after the execution of the state is completed. For example, while a precharge command is transmitted in the lower part of FIG. 5, a precharge state is entered, and the idle state is automatically returned to after the execution is completed.

Herein, the command set of the combination-combination type is performed along a certain fixed path, starting from the Idle state, and then returning to the Idle state after a test is executed. For example, for the situation that the coverage in a bold box is only the random sequence between paths, and the randomness is not high, a path SRPowerDown-Refresh-Commandbustraining may not be tested. That is, since the command set of the combination-combination type has certain human factors, a fixed jump path will be generated on a node to implement automatic jump. Therefore, even if a simulation test is conducted for many rounds, only a few paths are covered, such as paths SRPowerDown-Refresh-Commandbustraining, SRPowerDown-Refresh-MRR, and SRPowerDown-Refresh-MPCbasedtraining. However, in the embodiment of the present disclosure, each node in the single command-single command type needs to set a weight for judgment, so that the degree of freedom is higher, and after multiple rounds of simulation tests, all paths can theoretically be covered. Therefore, the difference between the two methods is that simulation tests can occur in large quantities, while combination-combination types cannot occur even in large quantities.

The embodiment of the disclosure provides a method for testing a command sequence. According to the method, aiming at the to-be-tested random command sequence, on the one hand, the coverage is improved, that is, the command is transmitted more randomly, and more combinations may be generated for one command sequence. On the other hand, the weight of an address operated by the command is constrained, and the memory cells corresponding to the normal address and redundant address are accessed in primary and secondary ways. On another hand, the weight of the command is constrained, and key testing on main functions are implemented by setting the weights of different commands. For example, the weight of a refresh command is set higher, which may increase the number of tests of the refresh command within a limited time. That is, the number of tests of more main functions can be increased within a limited time, and the testing efficiency is improved.

Figure 6:
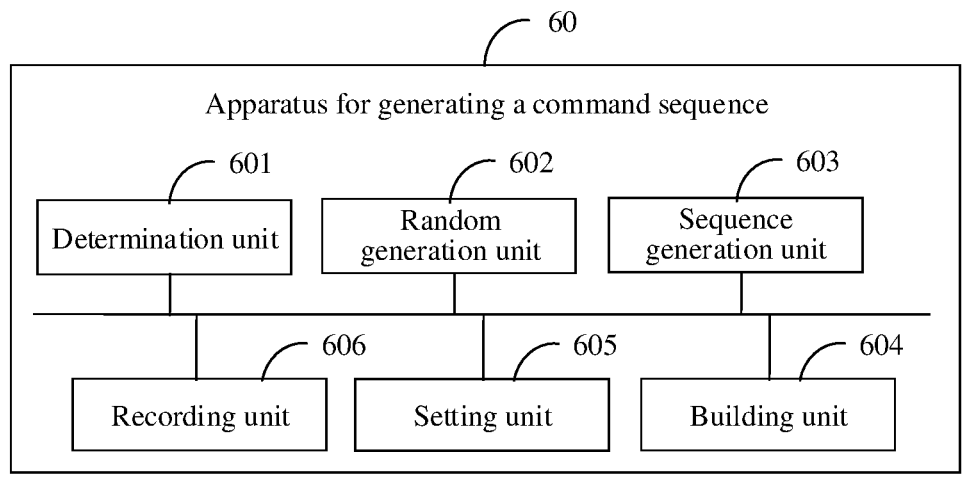
FIG. 6 is a structural composition diagram of an apparatus for generating a command sequence according to an embodiment of the disclosure.

In still another embodiment of the disclosure, referring to FIG. 6, which is a structural composition diagram of an apparatus 60 for generating a command sequence according to an embodiment of the disclosure. As shown in FIG. 6, the apparatus 60 for generating the command sequence may include: a determination unit 601, a random generation unit 602, and a sequence generation unit 603.

The determination unit 601 is configured to determine at least one executable CMD based on a state machine module according to a current state.

The random generation unit 602 is configured to acquire at least one command weight corresponding to the at least one executable CMD, and generate a random command from the at least one executable CMD by taking the command weight as a constraint condition.

The sequence generation unit 603 is configured to determine a next state based on the state machine module according to the random command, and take the next state as the current state to continuously execute the step of determining at least one executable CMD based on the state machine module according to the current state, to generate a random command sequence.

In some embodiments, referring to FIG. 6, the apparatus 60 for generating the command sequence may further include a building unit 604, configured to perform functional description and modeling on a plurality of commands to obtain a plurality of executable CMDs; determine at least two states of the state machine module; and build, based on the at least two states and the plurality of executable CMDs, a state jump relationship of the state machine module. The state jump relationship includes the respective command weights of the plurality of executable CMDs, the executable CMDs are configured to trigger a first state to jump to a next state, and the first state is any one of the at least two states.

In some embodiments, the determination unit 601 is further configured to acquire the at least one command weight corresponding to the at least one executable CMD from the respective command weights of the plurality of executable CMDs based on the state jump relationship.

In some embodiments, the determination unit 601 is further configured to select at least one executable CMD for triggering the current state to jump from the plurality of executable CMDs as at least one legal command corresponding to the current state.

The random generation unit 602 is configured to acquire at least one command weight corresponding to the at least one legal command, and generate the random command by jointly taking the at least one command weight and the at least one legal command as a constraint condition.

In some embodiments, the random generation unit 602 is further configured to acquire a plurality of memory addresses to be accessed by the random command; set address weights, each for a respective one of the plurality of memory addresses, and generate a random address by taking the address weight as a constraint condition. Herein, the random command is used to access the random address and perform functional testing.

In some embodiments, the random command sequence includes a plurality of command sequence units. Herein, each command sequence unit is composed of a random command and a random address.

In some embodiments, the memory address includes a first type of address and a second type of address. Referring to FIG. 6, the apparatus 60 for command sequence generation may further include a setting unit 605, configured to set a first weight value for the first type of address among the plurality of memory addresses, and set a second weight value for the second type of address among the plurality of memory addresses. Herein, the first type of address represents an address that has not been accessed by the random command, the second type of address represents an address that has been accessed by the random command, and the first weight value is greater than the second weight value.

In some embodiments, the first type of address includes a normal address and a redundant address. Correspondingly, the setting unit 605 is further configured to set a first primary-weight value for the normal address in the first type of address, and set a first secondary-weight value for the redundant address in the first type of address. Herein, the first primary-weight value is greater than the first secondary-weight value.

In some embodiments, referring to FIG. 6, the apparatus 60 for command sequence generation may further include a recording unit 606.

The determination unit 601 is further configured to determine that the random address is the second type of address corresponding to the random command after the random address is accessed by the random command.

The recording unit 606 is configured to store the random address in an address record table. Herein, the address record table is configured to record the second type of address that has been accessed by the random command, and different random commands correspond to different address record tables.

In some embodiments, the recording unit 606 is further configured to dynamically adjust the address weight of the second type of address stored in the address record table when the random command accesses the second type of address stored in the address record table again, to reduce the second weight value of the second type of address.

In some embodiments, the random command sequence is of a single command-single command type.

Figure 7:
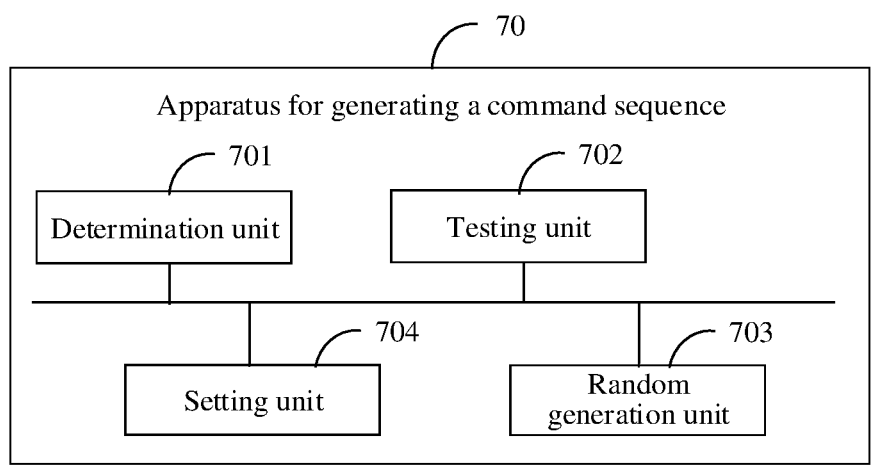
FIG. 7 is a structural composition diagram of an apparatus for testing a command sequence according to an embodiment of the disclosure.

In still another embodiment of the disclosure, referring to FIG. 7, FIG. 7 is a structural composition diagram of an apparatus 70 for testing a command sequence according to an embodiment of the disclosure. As shown in FIG. 7, the apparatus 70 for testing a command sequence may include: a determination unit 701, and a testing unit 702.

The determination unit 701 is configured to determine a to-be-tested random command sequence, the to-be-tested random command sequence including a plurality of command sequence units, and each command sequence unit being composed of a random command and a random address; and determine a random command according to a state machine module and a current state.

The testing unit 702 is configured to perform functional testing on a memory cell corresponding to the random address based on the random command.

In some embodiments, referring to FIG. 7, the apparatus 70 for testing a command sequence may further include a random generation unit 703.

The determination unit 701 is configured to determine at least one executable CMD based on the state machine module according to the current state.

The random generation unit 703 is configured to acquire at least one command weight corresponding to the at least one executable CMD, and generate a random command from the at least one executable CMD by taking the command weight as a constraint condition.

In some embodiments, the determination unit 701 is further configured to determine a next state based on the state machine module according to the random command.

The random generation unit 703 is further configured to take the next state as the current state to continuously execute the step of determining at least one executable CMD based on the state machine module according to the current state, to generate a next random command.

In some embodiments, the determination unit 701 is further configured to select at least one executable CMD for triggering the current state to jump from the plurality of executable CMDs as at least one legal command corresponding to the current state.

The random generation unit 703 is further configured to acquire at least one command weight corresponding to the at least one legal command, and generate the random command by jointly taking the at least one command weight and the at least one legal command as a constraint condition.

In some embodiments, the random generation unit 703 is further configured to acquire a plurality of memory addresses to be accessed by the random command; and set address weights, each for a respective one of the plurality of memory addresses, and generate a random address by taking the at least one address weight as a constraint condition.

The testing unit 702 is further configured to access the random address according to the random command, so as to execute the step of performing functional testing on the memory cell corresponding to the random address.

In some embodiments, the memory address includes a first type of address and a second type of address. Referring to FIG. 7, the apparatus 70 for testing the command sequence may further include a setting unit 704, configured to set a first weight value for the first type of address among the plurality of memory addresses, and set a second weight value for the second type of address among the plurality of memory addresses. Herein, the first type of address represents an address that has not been accessed by the random command, the second type of address represents an address that has been accessed by the random command, and the first weight value is greater than the second weight value.

It can be understood that, in the present embodiment, "unit" can be part of the circuit, part of the processor, part of the program or software, etc., of course, it can also be a module or non-modular. In addition, various constituent parts in the embodiments may be integrated into one processing unit, or each of the units may exist alone physically, or two or more units are integrated into one unit. The integrated unit may be implemented in a form of hardware, or may be implemented in a form of a software functional module.

When the integrated unit is implemented in the form of software function module and is not sold or used as an independent product, it can be stored in a computer readable storage medium. Based on such an understanding, the technical solutions of the embodiment essentially, or the part contributing to the prior art, or all or some of the technical solutions may be implemented in a form of a software product. The computer software product is stored in a storage medium and includes several instructions for instructing a computer device (which may be a personal computer, a server, a network device, or the like) or a processor (processor) perform all or some of the steps of the methods described in the embodiments. The foregoing storage medium includes: various media capable of storing program codes, such as a USB flash disc, a mobile hard disc, a Read Only Memory (ROM), a Random Access Memory (RAM), a magnetic disc, or a compact disc.

Therefore, the embodiment provides a computer readable storage medium. The computer storage medium stores a computer program, and when the computer program is executed by at least one processor, the method for generating a command sequence or the method for testing a command sequence according to any one of the foregoing embodiments is implemented.

Figure 8:
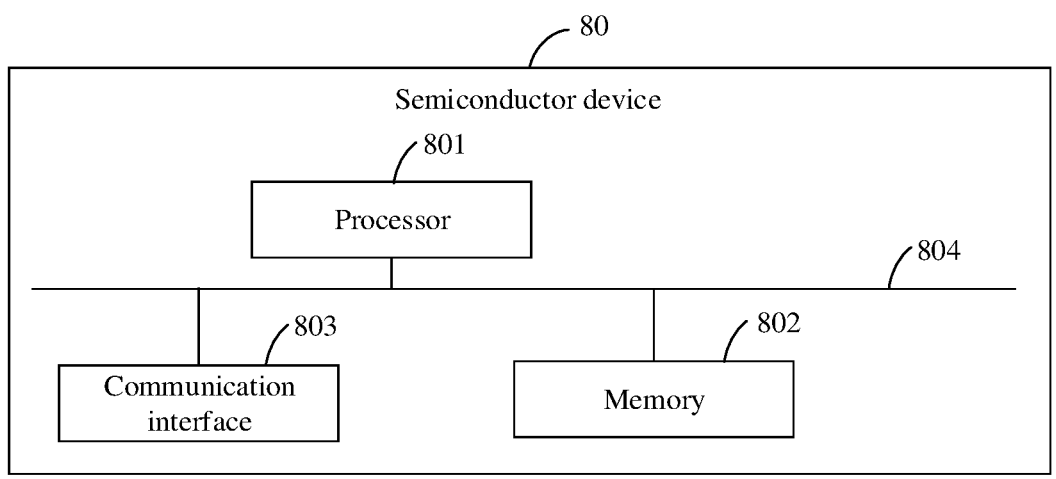
FIG. 8 is a structural schematic diagram of specific hardware of a semiconductor device according to an embodiment of the disclosure.

In still another embodiment of the disclosure, referring to FIG. 8, which is a structural schematic diagram of specific hardware of a semiconductor device 80 according to an embodiment of the disclosure. As shown in FIG. 8, the semiconductor device 80 may include a processor 801 and a memory 802. Herein, the memory 802 is configured to store a computer program that can be run on the processor 801, and the processor 801 is configured to execute the method for generating a command sequence or the method for testing a command sequence according to any one of the foregoing embodiments when running the computer program.

Furthermore, in some embodiments, the semiconductor device 80 may further include a communication interface 803, and a bus 804 for connecting the processor 801, the memory 802, and the communication interface 803.

In the embodiment of the disclosure, the above processor 801 may be at least one of an Application Specific Integrated Circuit (ASIC), a Digital Signal Processor (DSP), a Digital Signal Processing Device (DSPD), a Programmable Logic Device (PLD), a Field Programmable Gate Array (FPGA), a Central Processing Unit (CPU), a controller, a microcontroller and a microprocessor. It can be understood that other electronic devices may also be configured to realize functions of the processor for different devices, which is not specifically limited in the embodiments of the disclosure. The memory 802 included in the semiconductor device 80 may be connected with the processor 801. Herein, the memory 802 is configured to store an executable program code. The program code includes a computer operation instruction. The memory 802 may include a high-speed RAM memory and may also include a nonvolatile memory, for example, at least two disk memories.

In the embodiment of the present disclosure, the bus 804 is configured to connect the communication interface 803, the processor 801 and the memory 802 and communicate these devices with each other.

In the embodiment of the present disclosure, the memory 802 can store instructions and data. In practical applications, the above memory 802 may be a volatile memory, such as a Random-Access Memory (RAM); or a non-volatile memory, such as a Read-Only Memory (ROM), a flash memory, Hard Disk Drive (HDD) or Solid-State Drive (SSD); or a combination of the above kinds of memories, and provide instructions and data to the processor 801.

It can be understood that these embodiments described in the specification may be implemented by hardware, software, firmware, middleware, a microcode, or a combination thereof. For hardware implementation, the processing unit may be implemented in one or more Application Specific Integrated Circuits (ASICs), Digital Signal Processors (DSPs), Digital Signal Processing Devices (DSPDs), Programmable Logic Devices (PLDs), Field-Programmable Gate Arrays (FPGAs), general-purpose processors, controllers, microcontrollers, microprocessors, and other electronic units for performing the functions described in the disclosure, or a combination thereof.

For software implementation, the technologies described in the embodiments of the disclosure may be implemented by modules (for example, processes or functions) that perform the functions described in the embodiments of the disclosure. A software code may be stored in the memory and executed by the processor. The memory may be implemented in or outside the processor.

The embodiment of the disclosure provides a semiconductor device. The semiconductor device may be applied to generating a random command sequence with higher coverage. Herein, the probability of occurrence of single (piece) command is optimized by adjusting the weight, and the legality of transmission of the command sequence is constrained according to spec requirements; and different address blocks are assigned different weights, and the weights of the already accessed addresses may be dynamically adjusted, so that not only the coverage of functional testing of DRAM products may be improved, but also the testing efficiency may also be improved.

The foregoing descriptions are only preferred embodiments of the disclosure and are not intended to limit the scope of protection of the disclosure.

It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element.

The sequence numbers of the embodiments of the disclosure are adopted not to represent superiority-inferiority of the embodiments but only for description.

The methods disclosed in several method embodiments provided in the present disclosure may be arbitrarily combined without conflict to obtain a new method embodiment.

The characteristics disclosed in a plurality of product embodiments provided in the present disclosure may be arbitrarily combined without conflict to obtain a new product embodiment.

The characteristics disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

INDUSTRIAL PRACTICABILITY

The embodiments of the disclosure provide a method and device for generating a command sequence, a method and device for testing, and a storage medium. At least one executable CMD is determined based on a state machine module according to a current state; at least one command weight corresponding to at least one executable CMD is acquired, and a random command is generated from the at least one executable CMD by taking the at least one command weight as a constraint condition; a next state is determined based on the state machine module according to the random command, and the next state is taken as the current state to continuously execute the step of determining at least one executable CMD based on the state machine module according to the current state, to generate a random command sequence. Thus, since the generation of the random command sequence can be minimized to the single command-single command level, the randomness of command transmission is higher, so that when testing is performed according to the random command sequence, not only the functional testing coverage of DRAM products is improved, but also the testing efficiency is improved.

The invention claimed is:

1. A method for generating a command sequence, comprising:
    determining at least one executable Command (CMD) based on a state machine module according to a current state;
    acquiring at least one command weight corresponding to the at least one executable CMD, and generating a random command from the at least one executable CMD by taking the at least one command weight as a constraint condition; and
    determining a next state based on the state machine module according to the random command, and taking the next state as the current state to continuously execute the step of determining at least one executable CMD based on the state machine module according to the current state, to generate a random command sequence.

2. The method of claim 1, wherein before determining at least one executable CMD based on the state machine module, the method further comprises:
    performing functional description and modeling on a plurality of commands to obtain a plurality of executable CMDs;
    determining at least two states of the state machine module; and
    building, based on the at least two states and the plurality of executable CMDs, a state jump relationship of the state machine module,
    wherein the state jump relationship comprises respective command weights of the plurality of executable CMDs, each of the executable CMDs being configured to trigger a first state to jump to a next state, and the first state being any one of the at least two states.

3. The method of claim 2, wherein acquiring at least one command weight corresponding to the at least one executable CMD comprises:
    acquiring the at least one command weight corresponding to the at least one executable CMD from the respective command weights of the plurality of executable CMDs based on the state jump relationship.

4. The method of claim 2, further comprising:
    selecting the at least one executable CMD for triggering the current state to jump from the plurality of executable CMDs as at least one legal command corresponding to the current state,
    wherein acquiring the at least one command weight corresponding to the at least one executable CMD, and generating the random command from the at least one executable CMD by taking the command weight as the constraint condition comprises: acquiring at least one command weight corresponding to the at least one legal command, and generating the random command by jointly taking the at least one command weight and the at least one legal command as a constraint condition.

5. The method of claim 1, further comprising:
acquiring a plurality of memory addresses to be accessed by the random command; and
setting address weights, each for a respective one of the plurality of memory addresses, and generating a random access by taking the address weights as a constraint condition, wherein the random command is used to access a random address and perform functional testing.

6. The method of claim 5, wherein the random command sequence comprises a plurality of command sequence units, each command sequence unit being composed of the random command and the random address.

7. The method of claim 5, wherein the memory addresses comprise a first type of address and a second type of address, wherein setting address weights, each for a respective one of the plurality of memory addresses comprises:
setting a first weight value for the first type of address among the plurality of memory addresses, and setting a second weight value for the second type of address among the plurality of memory addresses,
wherein the first type of address represents an address that has not been accessed by the random command, the second type of address representing an address that has been accessed by the random command, and the first weight value being greater than the second weight value.

8. The method of claim 7, wherein the first type of address comprises a normal address and a redundant address, wherein setting a first weight value for the first type of address among the plurality of memory addresses comprises:
setting a first primary-weight value for the normal address in the first type of address, and setting a first secondary-weight value for the redundant address in the first type of address,
wherein the first primary-weight value is greater than the first secondary-weight value.

9. The method of claim 7, further comprising:
determining that the random address is the second type of address corresponding to the random command after the random address is accessed by the random command; and
storing the random address in an address record table, wherein the address record table is configured to record the second type of address that has been accessed by the random command.

10. The method of claim 9, further comprising:
when the random command accesses the second type of address stored in the address record table again, dynamically adjust the address weight of the second type of address stored in the address record table, to reduce the second weight value of the second type of address.

11. The method of claim 1, wherein the random command sequence is of a single command-single command type.

12. A method for testing a command sequence, comprising:
determining a to-be-tested random command sequence, wherein the to-be-tested random command sequence comprises a plurality of command sequence units, each command sequence unit being composed of a random command and a random address;
determining the random command according to a state machine module and a current state; and
performing functional testing on a memory cell corresponding to the random address based on the random command.

13. The method of claim 12, wherein determining the random command according to the state machine module and the current state comprises:
determining at least one executable Command (CMD) based on the state machine module according to the current state; and
acquiring at least one command weight corresponding to the at least one executable CMD, and generating the random command from the at least one executable CMD by taking the at least one command weight as a constraint condition.

14. The method of claim 13, further comprising:
determining a next state based on the state machine module according to the random command; and
taking the next state as the current state to continuously execute the step of determining at least one executable CMD based on the state machine module according to the current state, to generate a next random command.

15. The method of claim 13, further comprising:
selecting the at least one executable CMD for triggering the current state to jump from a plurality of executable CMDs as at least one legal command corresponding to the current state,
wherein acquiring at least one command weight corresponding to the at least one executable CMD, and generating the random command from the at least one executable CMD by taking the at least one command weight as the constraint condition comprises:
acquiring at least one command weight corresponding to the at least one legal command, and generating the random command by jointly taking the at least one command weight and the at least one legal command as a constraint condition.

16. The method of claim 12, wherein before performing functional testing on a memory cell corresponding to the random address based on the random command, the method further comprises:
acquiring a plurality of memory addresses to be accessed by the random command;
setting address weights, each for a respective one of the plurality of memory addresses, and generating the random address by taking the address weights as a constraint condition; and
accessing the random address according to the random command, to execute the step of performing functional testing on the memory cell corresponding to the random address.

17. The method of claim 16, wherein the memory addresses comprise a first type of address and a second type of address, wherein setting address weights, each for a respective one of the plurality of memory addresses comprises:
setting a first weight value for the first type of address among the plurality of memory addresses, and setting a second weight value for the second type of address among the plurality of memory addresses,
wherein the first type of address represents an address that has not been accessed by the random command, the second type of address represents an address that has been accessed by the random command, and the first weight value is greater than the second weight value.

18. A semiconductor device, comprising a memory and a processor, wherein
the memory is configured to store a computer program capable of running in the processor,
wherein the processor is configured to run the computer program to:
determine at least one executable Command (CMD) based on a state machine module according to a current state;
acquire at least one command weight corresponding to the at least one executable CMD, and generate a random command from the at least one executable CMD by taking the at least one command weight as a constraint condition; and
determine a next state based on the state machine module according to the random command, take the next state as the current state to continuously execute the step of determining at least one executable CMD based on the state machine module according to the current state, to generate a random command sequence.

19. A semiconductor device, comprising a memory and a processor, wherein the memory is configured to store a computer program capable of running in the processor,
wherein the processor is configured to run the computer program to execute the method according to claim 12.

\* \* \* \* \*